United States Patent [19]

Biswas et al.

[11] Patent Number: 4,790,625
[45] Date of Patent: * Dec. 13, 1988

[54] METHOD OF APPLYING HERMETIC COATING ON OPTICAL FIBER

[75] Inventors: Dipak R. Biswas; Satyabrata Raychaudhuri, both of Roanoke, Va.

[73] Assignee: Alcatel USA, Corp., New York, N.Y.

[*] Notice: The portion of the term of this patent subsequent to May 21, 2002 has been disclaimed.

[21] Appl. No.: 88,547

[22] Filed: Aug. 20, 1987

Related U.S. Application Data

[60] Continuation of Ser. No. 838,223, Mar. 10, 1986, abandoned, which is a division of Ser. No. 644,305, Aug. 24, 1984, Pat. No. 4,575,463, which is a continuation-in-part of Ser. No. 580,280, Feb. 17, 1984, Pat. No. 4,518,628, which is a continuation of Ser. No. 382,856, May 28, 1982, abandoned.

[51] Int. Cl.$^4$ .......................... G02B 6/10; G02B 6/22; G02B 6/00
[52] U.S. Cl. .............................. 350/96.33; 350/96.30; 350/96.34
[58] Field of Search ................ 350/96.30, 96.33, 96.34

[56] References Cited

U.S. PATENT DOCUMENTS

| | | | |
|---|---|---|---|
| 3,019,515 | 2/1962 | Whitehurst et al. | 350/96.33 |
| 3,436,141 | 4/1969 | Comte | 350/96.32 |
| 4,028,080 | 6/1977 | Di Vita et al. | 350/96.30 X |
| 4,118,211 | 10/1978 | Au Coin et al. | 427/163 X |
| 4,173,393 | 11/1979 | Maurer | 350/96.34 |
| 4,198,121 | 4/1980 | Le Davay et al. | 350/96.34 X |
| 4,319,803 | 10/1982 | Burmeister et al. | 350/96.34 X |
| 4,321,073 | 3/1982 | Blair | 427/126.2 X |
| 4,390,589 | 6/1983 | Geyling et al. | 428/381 |
| 4,410,567 | 10/1983 | France et al. | 350/96.33 X |
| 4,418,984 | 12/1983 | Wysocki et al. | 350/96.33 |
| 4,485,122 | 11/1984 | Williams et al. | 427/55 X |
| 4,512,629 | 4/1985 | Hanson et al. | 350/96.30 |
| 4,518,628 | 5/1985 | Biswas et al. | 429/55 |
| 4,594,266 | 6/1986 | Lemaire et al. | 427/55 |

FOREIGN PATENT DOCUMENTS

| | | | |
|---|---|---|---|
| 56-12602 | 2/1981 | Japan | 350/96.30 |
| 58-58501 | 4/1983 | Japan | 350/96.29 |
| 58-58502 | 4/1983 | Japan | 350/96.29 |

OTHER PUBLICATIONS

Rand, M. J., et al., "Silicon Oxynitride Films on Fused Silica for Optical Waveguides," Applied Optics, vol. 11, No. 11, 11–1972, pp. 2482–2488.

Grand, G., et al., "Optical Polarizers of High Extinction Ratio Integrated on Oxidized Silicon Substrate", Electronics Letters, vol. 20, No. 18, 8–84 pp. 730–731.

Almeida et al, "On Line-Metal Coating of Optical Fibers", OPTIK, vol. 53, No. 3, Jun. 1979, pp. 231–233.

Hartman et al, "Fabrication and Testing of a Nickel-Coated . . . ", Electronics Letters, vol. 18, No. 5, Mar. 1982, pp. 224–226.

Beales et al, "Practical Barrier to Hydrogen Diffusion . . . ", Electronics Letters, vol. 20, No. 4, Feb. 1984, pp. 159–161.

Primary Examiner—William L. Sikes
Assistant Examiner—Akm E. Ullah
Attorney, Agent, or Firm—Peter C. Van Der Sluys

[57] ABSTRACT

An optical fiber which has just been drawn from an optical preform is provided with two external hermetic coatings. The primary coating is a metallic or dielectric coating provided by, for example, using a heterogeneous nucleation thermochemical deposition (HNTD) technique. This technique involves passing the fiber through a reaction zone which contains a gaseous medium that includes a reactant which decomposes, or a mixture of reactants which chemically react, at a predetermined temperature, to form the material of the coating. Such predetermined temperature is available from the heat of the fiber forming process which is retained at the fiber surface by means of a shielding element so that additional heating means is not required. The second coating may be deposited, by for example, using an HNTD or a chemical vapor deposition process. The resulting fiber may then be provided with an additional polymer coating layer.

12 Claims, 4 Drawing Sheets

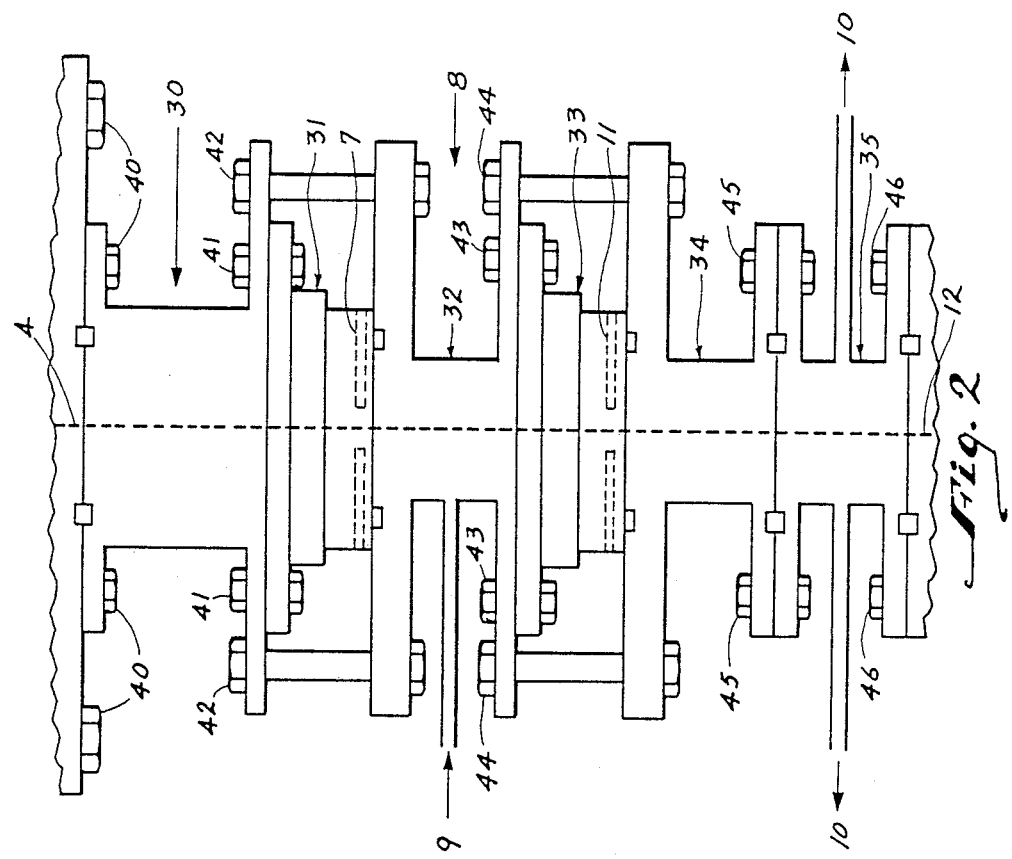
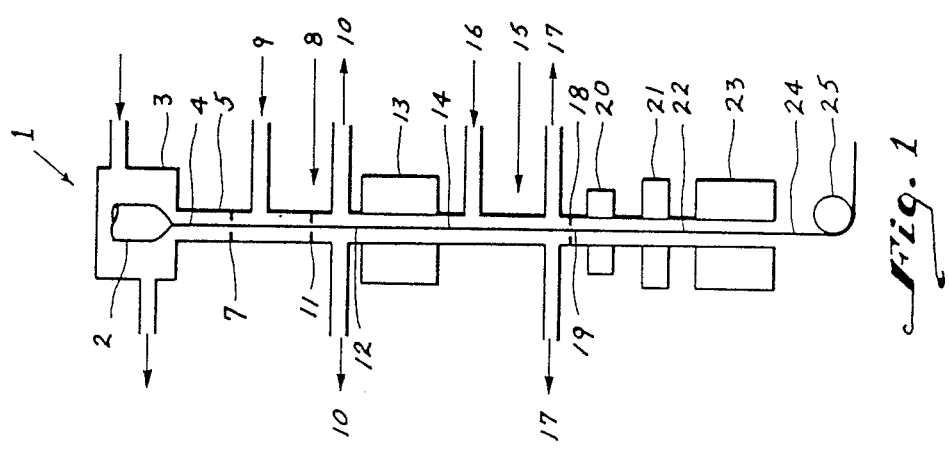

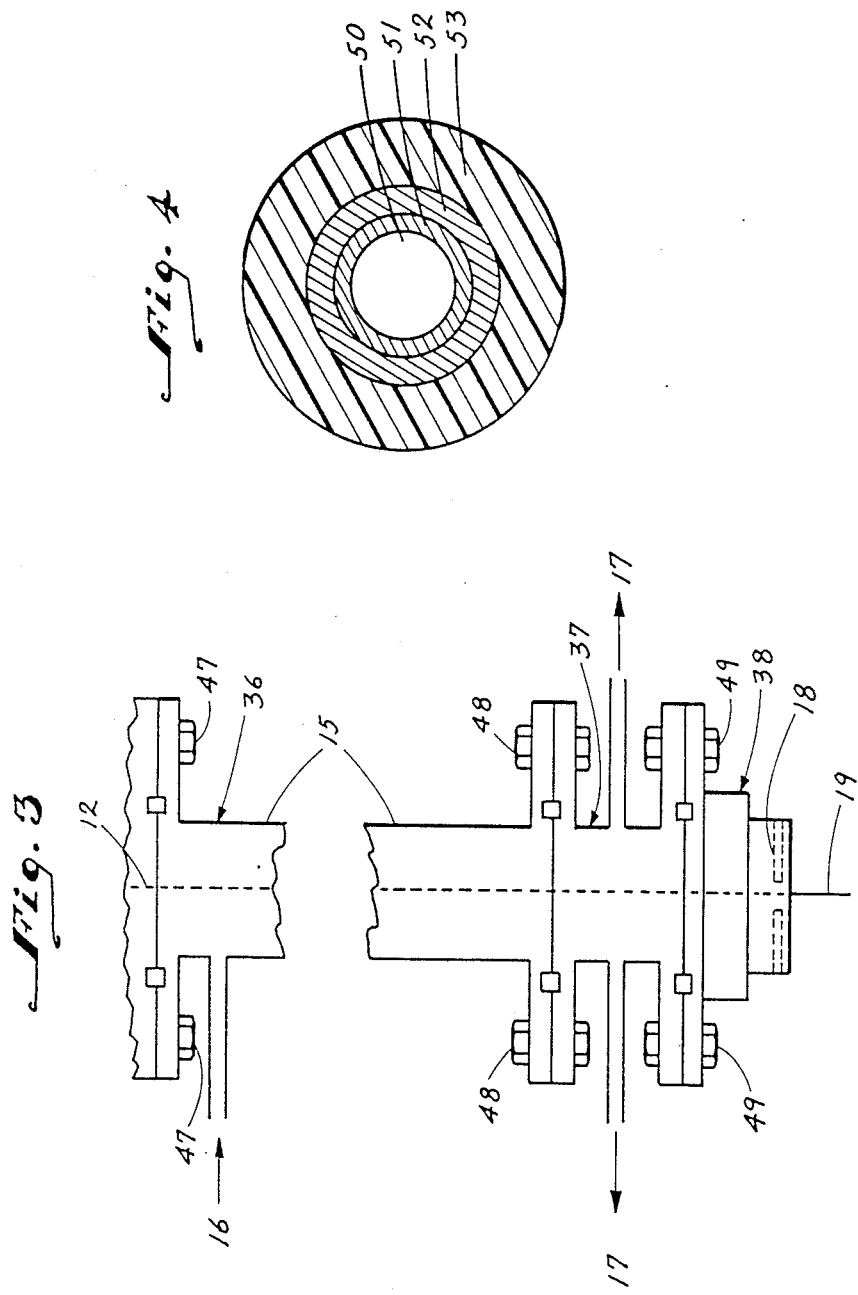

METHOD OF APPLYING HERMETIC COATING ON OPTICAL FIBER

This is a continuation of co-pending application Ser. No. 838,223, filed on Mar. 10, 1986, now abandoned, which is a division of application, Ser. No. 644,305 filed Aug. 24, 1984, now U.S. Pat. No. 4,575,463 issued Mar. 11, 1986, which is a continuation in part of application Ser. No. 580,280, filed Feb. 17, 1984, now U.S. Pat. No. 4,518,628 issued May 21, 1985, which is a continuation of Ser. No. 382,856, filed May 28, 1982, now abandoned.

BACKGROUND OF THE INVENTION

This invention relates generally to a method of coating optical glass fibers and in particular to such a method that is carried out immediately after the fiber is formed which results in reducing abrasion to the fiber and interaction of the environment with the fiber, and increasing the life time of the fiber during both storage and use.

Glass optical fibers when initially formed have high tensile strengths. After extended periods of use or storage the optical fibers may break when subjected to tensile stresses substantially lower than the original tensile strength rating of the fiber. One reason for this breakage, known as static fatigue, is the development of surface imperfections along the glass outer perimeter which form microcracks. This fatigue is at least in part attributable to the presence of water molecules and hydroxyl groups on the glass surface of the fibers. The water attacks the surface and causes formation of weak bonds which are broken by applied stress.

With glass-on-glass optical fibers where the core comprises a glass material and the cladding comprises a glass material, the presence of water molecules on the outer glass surface tends to cause the glass structure on the outer surface to become substantially weakened over a period of time so that the fiber ruptures under stress forces that would be incapable of causing the fibers to fracture in the absence of water or water vapor.

In the fiber forming operation, for example, fiber drawing, the glass-on-glass optical fiber is frequently coated with a polymer, such as a silicone resin immediately after formation in order to preserve its pristine strength and for handling ease. Although the silicone material is effective to prevent dust particles from contacting the outer glass surface, the silicone material is relatively pervious to water. Over a period of exposure in air, at ordinary concentrations of water vapor, water is able to permeate through the silicone layer and to interact with the outer glass surface, with the above-mentioned deleterious consequences.

The same mechanism of static fatigue occurs with plastic clad optical fibers where the core material comprises silica or other glass and the cladding comprises a silicone material or other polymer.

One method that has been employed in each of these fibers to overcome the problem of water penetration is the application of a thermoplastic resin over the silicone material. Although the extruded thermoplastic jacket covering the silicone material reduces the penetration of water through the silicone layer to some degree, water still can permeate through the jacket to the silicone material and from there to the glass surface of the core, again resulting in degradation of the core glass strength.

An alternative to using the silicone process is sealing the drawn fiber surface from the surrounding environment by coating the initially formed fiber with a metallic material, such as aluminum or nickel, or with a dielectric material, such as silicone nitride or tin oxide. Such sealing can be performed by using chemical vapor deposition (CVD). However, when using the CVD process for forming a first hermetic coating on the just-formed optical fiber, it has been found that the coating particles which are formed in the gaseous medium tend to impinge against the pristine glass fiber to produce surface damage, non-uniform coating thickness and large grains of coating material.

The interaction of coating particles with the fiber surface can be eliminated and an initial hermetic coating on the fiber may be obtained by means of a heterogeneous nucleation thermochemical deposition (HNTD) process thus preventing the degradation of fiber strength over the lifetime of the fiber. The HNTD process may be used to apply a coating, which may be either metallic or dielectric, to the freshly formed fiber. An important consideration in using the HNTD process is the surface temperature of the fiber since the coating particles are formed at the fiber surface. However, the thickness of the HNTD coating is usually thin, that is, much less than one micron for a fiber draw speed of approximately 20–40 meters per minute.

OBJECTS OF THE INVENTION

Accordingly, it is an object of the present invention to avoid the disadvantages of the prior art.

More particularly, it is an object of the present invention to develop a method for forming a uniform and adequately thick coating on an optical fiber to provide hermeticity.

Another object of the present invention is to provide a hermetic coating of a sufficient thickness on an optical fiber to provide a mechanical strength.

It is an additional object to develop an apparatus for performing the above method.

It is another object of this invention to develop a method for using the heat of the fiber retained from the fiber forming process to provide the level of temperature necessary for carrying out the primary coating process.

It is a further object of the present invention to provide an apparatus for retaining the heat of the fiber forming process at the fiber surface.

It is a still further object of this invention to provide an apparatus for applying optical fiber coatings which eliminates exposure to harmful coating ingredients.

It is still another object of the present invention to construct apparatus of the type here under consideration so as to be simple in construction, inexpensive to manufacture, and reliable in operation.

An additional object of the present invention is to design the apparatus of the above type so as to be capable of depositing the hermetic metallic and/or dielectric coatings on the fiber without reducing the mechanical strength of the fiber.

SUMMARY OF THE INVENTION

In pursuance of these objects and others which will become apparent hereafter, the present invention provides a method and apparatus for hermetically sealing an optical fiber immediately after formation. This is accomplished by providing the optical fiber with two hermetic coatings.

One feature of the present invention resides in a method of depositing the first of such coatings using the heat of the fiber from the fiber forming process to provide the temperature required for the deposition.

Another feature of the present invention resides in the provision of an apparatus including an insulated shielding element extending from the draw furnace through which the fiber passes in order to maintain the surface temperature of the fiber.

An additional feature of the invention is to maintain a pressure just below atmospheric pressure inside the reaction chamber so that reactants used for the deposition process cannot escape from the reactor.

Still another feature of the present invention resides in the provisions of an apparatus in which each of the sections of the apparatus may be easily removed or replaced by another section which performs the same function.

BRIEF DESCRIPTION OF THE DRAWING

Above-mentioned and other features and objects of this invention will become more apparent by reference to the following description taken in conjunction with the accompanying drawing, in which:

FIG. 1 is a diagrammatic side elevational view of an apparatus according to the present invention for producing a coated fiber; and FIG. 2 is a side elevational view of the upper portion of the apparatus of FIG. 1 illustrating a modular construction;

FIG. 3 is is a side elevational view of the lower portion of the apparatus illustrating also a modular construction; and FIG. 4 is a cross-sectional view of a coated fiber as produced by the apparatus of FIG. 1.

DETAILED DESCRIPTION OF THE PREFERRED EMBODIMENT

Apparatus for producing primary and secondary coatings on an optical fiber is identified in FIG. 1 generally by reference numeral 1. An optical fiber 4 is drawn from a preform 2 by a drawing mechanism 25 mounted at the end of the apparatus 1 and is hermetically sealed during such drawing process. The optical fiber 4 is drawn in a draw furnace 3 in a conventional manner. The portion of the preform 2 which is received in the draw furnace 3 is heated in a conventional manner, such as by hot gases, a plasma flame or by radiation.

As may be seen in FIG. 4, the formed fiber 4 in its final condition existing after it has emerged from a curing oven 23 includes an optical fiber 50, such as glass or the like, a primary hermetic coating 51 produced by, for example, the heterogeneous nucleation thermochemical deposition process in a primary reactor 8, a secondary coating 52 produced by chemical vapor deposition, for example, in a secondary reactor 15 and an outer coating 53 of organic material which is produced in a polymer coater 21 and cured in the curing oven 23.

When the fiber is drawn from a solid preform, it passes through a polymer coater to preserve the pristine fiber surface and for handling ease as is conventional in fiber drawing processes. Thus, the primary coating and the secondary coating processes of this invention have to be carried out in between the drawing furnace 3 and the polymer coater 21.

Referring again to FIG. 1, immediately after the fiber leaves the draw furnace 3, the primary coating 51 is applied to its outer surface. The freshly drawn fiber 4 must be provided with the primary coating 51 prior to suffering any appreciable damage due to environmental influences. To achieve this, the draw furnace 3 and the primary reactor 8 may either be situated directly above one another or form a structural unit by having a common housing or, as shown in FIG. 1, a tubular insulating shielding element 5 may be interposed between the draw furnace 3 and the reactor 8. The fiber 4 then passes through the interior of the insulating shielding element 5 and is thus protected from environmental influences.

One process of applying the primary coating is by means of a heterogeneous nucleation thermochemical deposition (HNTD) process as described in co-pending application Ser. No. 580,280, filed Feb. 17, 1984, now U.S. Pat. No. 4,518,628 which is a continuation of application Ser. No. 382,856, filed May 28, 1982, in the names of D. R. Biswas and D. K. Nath, incorporated herein by reference. In this process the fiber 4 passes into the interior of the reactor 8 which has an inlet port 9 into which a reactant gas is admitted and outlet ports 10 from which the spent reactant gas is discharged. The reactant gas consists of or contains at least one reactant or substance which, when heated to a predetermined temperature, releases the material of the hermetic coating which is to be applied to the exterior of the fiber 4 in the primary reactor 8. In this application, elliptical mirrors reflect radiation emitted from an infrared source to heat the surface of the fiber so that the reaction may take place thereon. By this process, formation of the coating particles occurs at the fiber surface rather than at an area adjacent the fiber surface thereby substantially eliminating impingement of such particles on the pristine glass surface. This process produces a coating material having a fine grained structure without the growth cones experienced with prior art processes.

In the present invention, the temperature needed for performing the HNTD process is obtained by retention of the heat from the fiber forming process. The fiber 4 is drawn from the preform 2 in the draw furnace 3 at a draw temperature of approximately 2200° C. As the just drawn fiber 4 emerges from the draw furnace 3 it is still hot from the drawing operation. In order to prevent the fiber 4 from losing its heat by exposure to surrounding air, the fiber 4 passes through the insulating shielding element 5. By means of this insulating shielding element 5, the temperature necessary for formation of the primary coating particles at the fiber surface will be maintained at the fiber surface without the need for additional heating means. It has been found that as the distance between the draw furnace 3 and the primary reactor 8 increases, the surface temperature of the fiber 4 decreases. However, as the draw speed increases, the surface temperature of the fiber 4 can be retained at a higher level than during a slower draw speed due to decreased time in the reactor and consequent shortened length of time during which loss of heat from the fiber surface can occur. It has also been found that, as the diameter of the fiber is increased, the surface temperature of the fiber 4 is increased for a fixed draw speed. Additionally, as the gas flow rate is increased, the surface temperature of the fiber 4 is decreased due to the cooling effect of the increased flow. By experimentation, the distance between the draw furnace 3 and the primary reactor 8, draw speed, fiber diameter, gas flow rates and other parameters which resulted in successful deposition of either metallic or dielectric primary coatings were determined.

It has been found that temperatures at the fiber surface of up to approximately 600° C. were retained from the drawing process.

A preheater (not shown) positioned around the shielding element 5 may be used to minimize the difference between the surface temperature of the fiber 4 and the surrounding environment. Therefore, the drop in the surface temperature of the fiber 4 is reduced. The use of reactants which deposit at greater surface temperatures is then possible. The preheater may be a resistance heating furnace, a quartz heating element or any other suitable means.

It may be seen that the reactant gas passes through the primary reactor 8 in cocurrent flow to the advancement of the fiber 4 through the reactor 8.

The vapor of the volatile metal compounds constituting the reactants entering the inlet port 9 is generated by evaporation. This evaporation may be accomplished either by heating a volatile compound or by passing a non-reactive gas over or through the volatile compound and reacting into immediately at the surface of the fiber 4 with simultaneous deposit. It may be seen that the reactant gas passes through the primary reactor 8 in cocurrent flow to the advancement of the fiber 4 through the reactor 8. Any volatile byproducts must be transported away through the exhaust ports 10.

Most of the reactant gases used in the primary deposition process are harmful. Therefore the primary reactor 8 is designed to maintain a pressure inside the reactor which is just below that of the ambient atmosphere so that the reactants cannot escape from the reactor during movement of the fiber 4 therethrough. Such pressure in the reactor 8 is maintained below that of the ambient atmosphere by means of a vacuum system, exhaust pump or other suitable means.

Irises 7 and 11 are positioned at the entrance and exit respectively of the primary reactor 8 in order to help retain the reactants inside the reactor 8 while permitting passage of the fiber being coated therethrough. The iris 7 additionally prevents escape of the heat of the drawing furnace 3.

The particular construction of the shielding element 5 and primary reactor 8 is more fully described below with reference to FIG. 2.

The following examples of primary coating deposition using retained heat from a fiber forming process are given by way of illustration:

EXAMPLE 1

Metallic coatings, of, for example, aluminum and nickel, were deposited on hot optical glass fiber by carrying out an HNTD, CVD or other deposition process using as reactants tri-isobutyl aluminum and isobutylene at 260° C. for aluminum deposition, and nickel carbonyl at 200° C. for nickel deposition. These temperatures were retained from the fiber forming process. The results of strength and static fatigue of both the aluminum and nickel coated fibers show an improvement of 20-40% over an uncoated fiber drawn from the same optical preform. Other metals can also be deposited on optical fiber by using this process.

EXAMPLE 2

A dielectric coating, of, for example, tin oxide was deposited on a hot optical glass fiber by carrying out conventional CVD reaction of tetramethyl tin and oxygen on a hot optical glass fiber at around 500° C. This heat was retained from the fiber forming process. The results of strength and static fatigue of the tin oxide coated fiber show an improvement of more than 20% over an uncoated fiber drawn from the same preform. Other dielectrics, such as silicon nitride, oxynitride, boron nitride, any oxides and carbides can be deposited on optical fibers by using this process.

While we have described the formation of the primary coating using the HNTD process, it is clear that the retained heat process may be used with an optical fiber which has a coating deposited by any other suitable means as long as that coating provides the basis necessary for the deposition and adherence of a secondary coating having strength, uniformity and hermeticity.

Where the primary coating 51 is applied by a CVD process, the secondary hermetic coating 52 is deposited on the first coating 51 in order to minimize or eliminate any pin holes which may have formed in the first coating 51. Where the primary coating 51 is deposited by an HNTD or other process it may be desirable to increase the overall thickness of the coating to further improve hermeticity by the application of a secondary coating 52.

Referring still to FIG. 1, it may be seen that the fiber 4 which has acquired a primary hermetic coating in the reactor 8, is identified as fiber 12. The fiber 12 is conducted through the secondary reactor 15. At this point, the surface temperature of the primary coated fiber 12 has dropped, due to loss of retained heat, below the temperature required for a secondary coating deposition by means of the HNTD process. It is, therefore, necessary to supply additional heat to the coated fiber 12. This heating may be accomplished by means of a heater 13 which heats the fiber 12 before it enters the secondary reactor 15. The heater 13 may be a resistance heater, laser heater, plasma heater, infrared heater or any other suitable source. The heated fiber 12, then enters the secondary reactor 15 where the second coating 52 may be deposited by means of the HNTD process in which the growth of coating particles and the deposition thereof both occur at the outer surface of the primary coating 51.

The secondary deposition process may be accomplished by means of a CVD or other process where the growth of the coating particles occurs at an area adjacent to the primary coated surface and the formed particles are deposited onto the primary coating 51. In the CVD process the reactant gas is heated to bring the temperature of the reactant gas to the level required for deposition to occur. One way to accomplish this is to have the secondary reactor 15 provided with a heater (not shown). In this way, the heater will heat the contents of the secondary reactor 15 and will thereby bring the temperature of the reactant gas to the temperature level required for deposition onto the primary coated fiber 15 to occur. Such a heater may be a resistance heater, laser heater, plasma heater, infra-red heater or any other suitable source.

In the HNTD process the primary coated fiber 12 is conducted into the interior of the secondary reactor 15 which has an inlet port 16 into which an reactant gas is admitted and outlet ports 17 from which the spent reactant gas is discharged. A currently preferred construction of the secondary reactor 15 is more fully described below with reference to FIG. 3. As described above, in the HNTD process for depositing the primary coating 51 the reactant gas consists of or contains at least one reactant or substance which, when heated to a predetermined temperature, releases the material of the hermetic coating which is to applied to the exterior of a fiber. In the secondary deposition process the coating particles are applied to the exterior of the primary coated fiber 12.

The vapor of the volatile metal compounds constituting the reactants entering the inlet port 16 is generated by evaporation. This evaporation may be accomplished either by heating a volatile compound or by passing a non-reactive gas over or through the volatile compound and reacting into metal or dielectric immediately at the surface of the fiber 12 with simultaneous deposit. It may be seen that the reactant gas passes through the secondary reactor 15 in cocurrent flow to the advancement of the fiber 12 through the reactor 15. Any volatile byproducts must be transported away through the outlet ports 17.

The secondary reactor 15 is also designed to maintain a pressure inside the reactor that is slightly below that of the atmosphere so that the reactants cannot escape from the reactor 15 during movement of the fiber 12 therethrough. Irises 14 and 18 are positioned at the entrance and exit respectively of the secondary reactor 15 to aid in preventing escape of the reactant gas.

Referring back to FIG. 1, a diameter controller, designated as 20 may be provided after the iris 18 to permit supervision of the drawing operation.

As shown in FIG. 2, the shielding element 5, the iris 7, the inlet port 9, the iris 11 and the outlet ports 10 and the primary reactor 8 are each incorporated in separate modules of the apparatus 1. In FIG. 3, it can be seen that the inlet port 16 and the outlet ports 17 of the secondary reactor 15 are also each incorporated in separate modules of the apparatus 1. Each of these modules is joined to another module and each can be easily separated therefrom. This construction is referred to as a modular construction. By means of this modular construction each of these modules, indicated in FIG. 2 and 3 by reference numbers 30-38, can be removed or replaced for repair, cleaning, or other maintanence without having to disassemble the entire apparatus 1. There are several other advantages to this type of modular construction. For example, if it is desired to increase the thickness of the primary coating 51 by increasing the dwell time of the optical fiber in the primary reactor 8, rather than reducing the drawing speed, the length of the primary reactor 8 may be increased. This is easily accomplished by replacement of the modular unit 32 with another unit having a longer length but performing the same function as the original unit 32. Another advantage is that the separate units may be repositioned to permit coaxial alignment of the internal bore of the separate units with the fiber passing therethrough. In this way, the fiber may be so positioned as to pass through the center of the opening in each of the irises 7, 11, 14 and 18. If the fiber were to pass through such irises off center, damage could occur to the outer surface of the fiber. Additionally, coaxial alignment of the fiber and the internal bore of the separate unit will allow the reactant gasses to flow more evenly between the outer surface of the fiber and the bore of the unit resulting in a more uniform deposition of the primary and secondary coatings. Although the secondary reactor 15 is shown in FIG. 3 as one unit, it may consist of several modules in a manner similar to that of the primary reactor 8. Such modules may be interposed at the breakline indicated in FIG. 3. Also at the breakline may be interposed the heater referred to above with respect to the application of a secondary coating by a CVD process.

The separate units 30-38 are joined together by any suitable securing means, such as nuts and bolts passing through holes located in laterally extending portions of each unit. The unit 30 which constitutes the shielding element 5 is joined to the drawing furnace 3 by securing elements 40. The unit 31 containing the iris 7 is secured to the unit 30 by securing elements 41. The unit 32 containing the inlet port 9 is secured to unit 30 by securing elements 42. In a similar manner, the unit 33 is secured to the unit 32, the unit 34 is secured to the unit 32, and the unit 35 is secured to joins the unit 34 in turn by respective securing elements 43, 44 and 45. Securing elements 46 join the primary reactor 8 to the lower portion of the apparatus 1. Referring to FIG. 3, it is seen that modular units of the secondary reactor 15 are secured in a comparable manner. The unit 37 is secured to the units 36 and 49. Securing elements 47 join the secondary reactor to 15 to the upper portion of the apparatus 1, in particular, the iris 14. Additional modular units may be interposed between the structure shown in FIGS. 2 and 3, namely between the units 35 and 36. For example, the iris 14 may be constructed in a modular manner analogous to that of the irises 7 and 11.

Also, in FIG. 1 it may be seen that the fiber 19 which has acquired both a primary and a secondary coating is conducted through the interior of the polymer coater 21 after emerging from the secondary reactor 15. The polymer coater 21 is of conventional construction so that no details thereof may be discussed here. Suffice it to say that at least one additional layer of coating of an organic material such as a polymer is applied on top of the before mentioned hermetic coatings produced in the reactors 8 and 15. The fiber 19, after this polymer coating 53 has been applied thereto, is converted into a fiber 22 which passes through the curing oven 23 where the polymer coating 53 is cured, especially by applying heat thereto, to give the coating the desired properties. Even the construction of the curing oven 23 is conventional and will not be described here. Finally, the fiber 22 which has been converted into a coated fiber 24 reaches the drawing arrangement or spool 25 to be wound thereon for at least temporary storage purposes.

While we have described above the principles of our invention in connection with specific apparatus it is to be clearly understood that this description is made only by way of examples and not as a limitation to the scope of our invention as set forth in the objects thereof and in the accompanying claims.

We claim:

1. A hermetic coating for an optical fiber comprising: a material, having a fine grained structure without growth cones, formed on the outer surface of the fiber at a time when the fiber is just formed and retains sufficient heat to cause said material to form at the surface of said fiber rather than adjacent thereto, said material being formed from reactants at a temperature of at least 200° C., said material being selected from the group consisting of a metallic material and a dielectric material.

2. The coating of claim 1 wherein the temperature is less than 1400° C.

3. The coating of claim 1 wherein the metallic material coating has an increased strength of 20-40 percent over uncoated fibers.

4. The coating of claim 1 wherein the dielectric material coating has an increased strength of 20% over uncoated fibers.

5. The coating of claim 1 wherein the metallic material is selected from the group consisting of aluminum and nickel.

6. The coating according to claim 21 wherein the reactants for the nickel metallic material include nickel carbonyl.

7. The coating of claim 1 wherein the dielectric material is selected from the group consisting of nitrides, oxides and carbides.

8. The coating according to claim 7 wherein the oxides include tin oxide.

9. The coating according to claim 7 wherein the nitrides include silicon nitride, oxynitride and boron nitride.

10. A hermetically protected high strength optical fiber comprising:
an optical fiber; and
a primary coating, having a fine grained structure without growth cones, formed on the outer surface of the fiber at a time when the fiber is formed and retains sufficient heat to cause said material to form at the surface of said fiber, said material being formed from reactants at a temperature of at least 200° C. said material being selected from the group consisting of a metallic material and a dielectric material.

11. The optical fiber according to claim 10 further comprising a secondary coating deposited on said primary coating.

12. A hermetic coating for an optical fiber comprising:
a material formed on the outer surface of the fiber from reactants at a temperature of at least 200° C., said material being selected from the group consisting of a metallic material and a dielectric material wherein the metallic material is selected from the group consisting of aluminum and nickel and the reactants for the aluminum metallic material include tri-isobutyl aluminum and isobutylene, the dielectric material is selected from the group consisting of tin oxide, silicon nitride, oxynitride, and boron nitride.

* * * * *

UNITED STATES PATENT AND TRADEMARK OFFICE
CERTIFICATE OF CORRECTION

PATENT NO. : 4,790,625
DATED : December 13, 1988
INVENTOR(S) : Dipak R. Biswas; Satyabrata Raychaudhuri It is certified that error appears in the above-identified patent and that said Letters Patent are hereby corrected as shown below:

Claim 6, line 1, please delete "21" and insert --5--.

Signed and Sealed this

Twenty-first Day of March, 1989

Attest:

DONALD J. QUIGG

Attesting Officer

Commissioner of Patents and Trademarks